(12) United States Patent
Kim et al.

(10) Patent No.: US 10,395,951 B2
(45) Date of Patent: Aug. 27, 2019

(54) METHOD OF CLEANING A SUBSTRATE AND APPARATUS FOR PERFORMING THE SAME

(71) Applicant: Samsung Electronics Co., Ltd., Suwon-si (KR)

(72) Inventors: Seok-Hoon Kim, Seongnam-si (KR); Kyoung-Seob Kim, Hwaseong-si (KR); Dong-Chul Kim, Hwaseong-si (KR); Hyo-San Lee, Hwaseong-si (KR)

(73) Assignee: SAMSUNG ELECTRONICS CO., LTD., Yeongtong-gu, Suwon-si, Gyeonggi-do (KR)

( * ) Notice: Subject to any disclaimer, the term of this patent is extended or adjusted under 35 U.S.C. 154(b) by 81 days.

(21) Appl. No.: 15/442,481

(22) Filed: Feb. 24, 2017

(65) Prior Publication Data
US 2017/0330770 A1 Nov. 16, 2017

(30) Foreign Application Priority Data
May 16, 2016 (KR) .......... 10-2016-0059285

(51) Int. Cl.
| B08B 3/00 | (2006.01) |
| H01L 21/67 | (2006.01) |
| B08B 1/04 | (2006.01) |
| B08B 3/02 | (2006.01) |
| B08B 3/10 | (2006.01) |

(52) U.S. Cl.
CPC .......... *H01L 21/67051* (2013.01); *B08B 1/04* (2013.01); *B08B 3/02* (2013.01); *B08B 3/024* (2013.01); *B08B 3/10* (2013.01); *H01L 21/67* (2013.01); *H01L 21/67253* (2013.01)

(58) Field of Classification Search
None
See application file for complete search history.

(56) References Cited

U.S. PATENT DOCUMENTS

| 5,888,054 A | 3/1999 | Djordjevic |
| 5,975,098 A | 11/1999 | Yoshitani et al. |
| 6,475,072 B1 | 11/2002 | Canaperi et al. |
| 7,364,626 B2 | 4/2008 | Hirose et al. |
| 7,913,346 B2 | 3/2011 | Iwami et al. |
| 8,511,583 B2 | 8/2013 | Liu et al. |
| 8,523,332 B2 | 9/2013 | Drury et al. |
| 8,651,625 B2 | 2/2014 | Karlinski |
| 8,727,475 B2 | 5/2014 | Bibl et al. |

(Continued)

FOREIGN PATENT DOCUMENTS

| JP | 2002-011419 A | 1/2002 |
| JP | 2003234321 A | 8/2003 |

(Continued)

*Primary Examiner* — Eric W Golightly
(74) *Attorney, Agent, or Firm* — Muir Patent Law, PLLC

(57) ABSTRACT

In a method of cleaning a substrate, a protecting liquid may be sprayed to a surface of the substrate from a first position in a first spray direction. Cleaning droplets may be injected on to the surface of the substrate. The protecting liquid may be sprayed to the surface of the substrate from a second position different from the first position in a second spray direction. For example, the protecting liquid may be always sprayed from the central portion toward the edge portions in the substrate so that the protecting liquid on the substrate may have a uniform thickness.

12 Claims, 12 Drawing Sheets

(56) References Cited

U.S. PATENT DOCUMENTS

| | | |
|---|---|---|
| 8,757,177 B2 | 6/2014 | Kholodenko et al. |
| 9,048,269 B2 | 6/2015 | Higashijima et al. |
| 9,142,399 B2 | 9/2015 | Ishibashi |
| 9,595,434 B2 | 3/2017 | Kim et al. |
| 2002/0005214 A1 | 1/2002 | Tomita et al. |
| 2002/0026931 A1 | 3/2002 | Kurosawa et al. |
| 2004/0087158 A1 | 5/2004 | Izumi et al. |
| 2005/0158671 A1 | 7/2005 | Shimizu et al. |
| 2006/0249182 A1 | 11/2006 | Hayamizu et al. |
| 2007/0181153 A1 | 8/2007 | Kobayashi et al. |
| 2008/0233753 A1 | 9/2008 | Idani |
| 2008/0251107 A1 | 10/2008 | Osada et al. |
| 2008/0265564 A1 | 10/2008 | Thomas |
| 2009/0025755 A1 | 1/2009 | Eom et al. |
| 2009/0085138 A1 | 4/2009 | Ryu et al. |
| 2011/0031326 A1 | 2/2011 | Sato |
| 2011/0165823 A1 | 7/2011 | Ide et al. |
| 2011/0262650 A1 | 10/2011 | Lee |
| 2012/0129346 A1 | 5/2012 | Ryuzaki et al. |
| 2012/0222707 A1 | 9/2012 | Sato et al. |
| 2012/0247506 A1 | 10/2012 | Tanaka et al. |
| 2013/0061884 A1 | 3/2013 | Yang et al. |
| 2014/0087568 A1 | 3/2014 | Noda et al. |
| 2014/0190633 A1 | 7/2014 | Maeda et al. |
| 2014/0261572 A1* | 9/2014 | Sotoku .............. H01L 21/67028 134/33 |
| 2014/0273454 A1 | 9/2014 | Huang et al. |
| 2014/0373877 A1 | 12/2014 | Inoue et al. |
| 2016/0027637 A1 | 1/2016 | Kim et al. |
| 2016/0118275 A1 | 4/2016 | Inoue et al. |

FOREIGN PATENT DOCUMENTS

| | | |
|---|---|---|
| JP | 2006-165372 A | 6/2006 |
| JP | 2008-108830 A | 5/2008 |
| JP | 2012-216777 A | 11/2012 |
| JP | 5148156 B2 | 2/2013 |
| JP | 2013-077597 A | 4/2013 |
| JP | 2015-103704 A | 6/2015 |
| KR | 10-0471750 B1 | 3/2005 |
| KR | 10-0591163 B1 | 6/2006 |
| KR | 0696381 B | 3/2007 |
| KR | 0853148 B | 8/2008 |
| KR | 10-1319744 B1 | 10/2013 |

\* cited by examiner

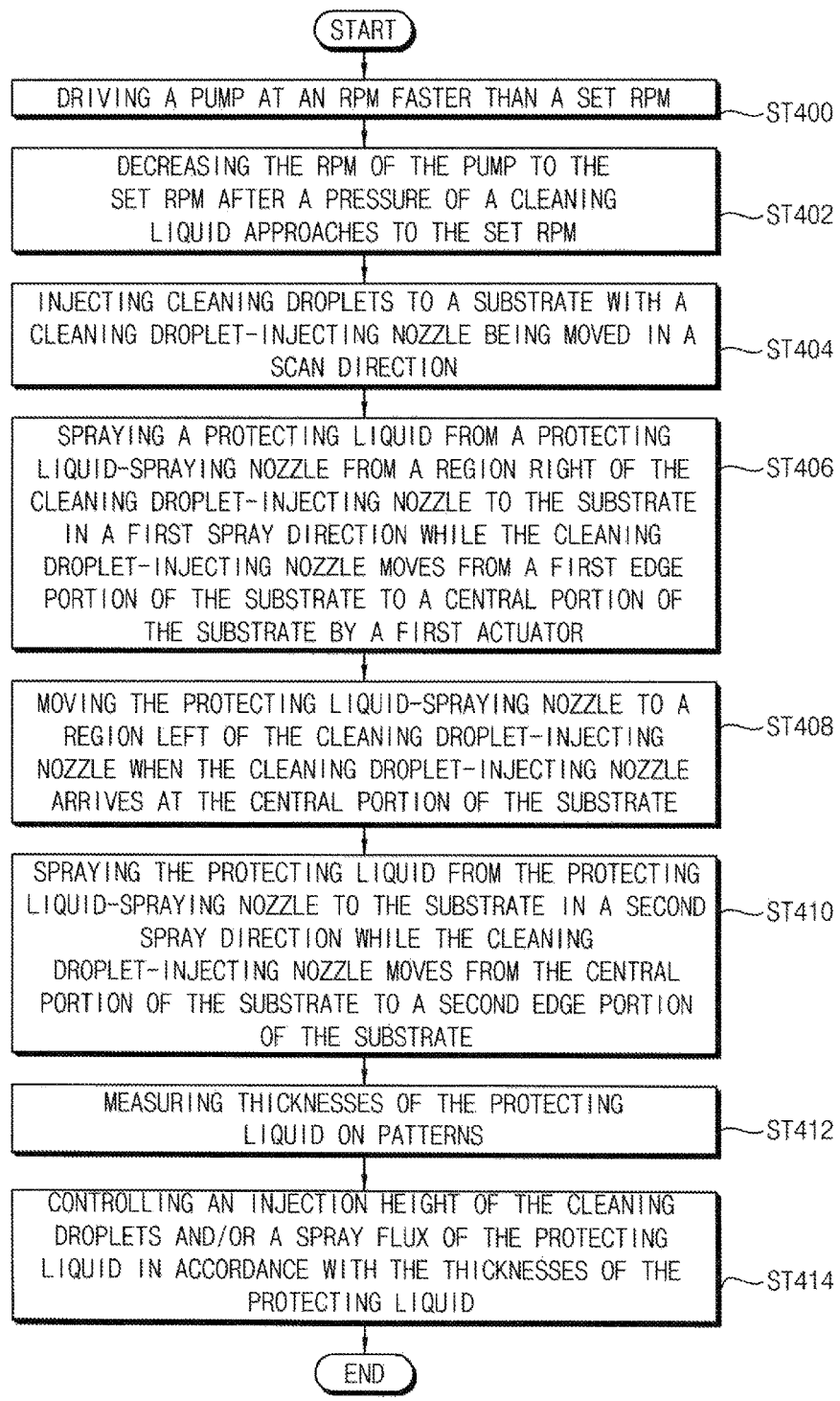

METHOD OF CLEANING A SUBSTRATE AND APPARATUS FOR PERFORMING THE SAME

CROSS-REFERENCE TO RELATED APPLICATIONS

This application claims priority under 35 USC § 119 to Korean Patent Application No. 2016-59285, filed on May 16, 2016 in the Korean Intellectual Property Office (KIPO), the contents of which are herein incorporated by reference in their entirety.

BACKGROUND

1. Field

Example embodiments relate to a method of cleaning a substrate and an apparatus for performing the same. For example, example embodiments relate to a method of cleaning a semiconductor substrate using a protecting liquid and cleaning droplets, and an apparatus for performing the method.

2. Description of the Related Art

Generally, an exposing process may be performed on a layer on a semiconductor substrate to form a pattern. In order to remove byproducts on the semiconductor substrate generated in the exposing process, the semiconductor substrate may be cleaned.

According to related arts, the semiconductor substrate may be cleaned by a double feature type cleaning process. In the double feature type cleaning process, cleaning droplets may be injected on a surface of the semiconductor substrate with spraying of a protecting liquid to remove the byproducts.

When the protecting liquid is thick, detergency may decrease because the cleaning liquid may not be provided sufficiently to the pattern. In contrast, when the protecting liquid is thin, the pattern may be damaged, and one reason of this may be a high injection pressure of the cleaning droplets. The detergency may depend on a thickness of the protecting liquid.

SUMMARY

Example embodiments provide a method of cleaning a substrate that may be capable of improving detergency and/or reducing damage of patterns.

Example embodiments also provide an apparatus for performing the above-mentioned method.

According to example embodiments, there may be provided a method of manufacture. In the method of manufacture, a protecting liquid may be sprayed on a first portion of a surface of the substrate from a first position along a first spray direction. Cleaning droplets may be injected on the first portion of the surface of the substrate. The protecting liquid may be sprayed on a second portion of the surface of the substrate from a second position different from the first position along a second spray direction. Cleaning droplets may be injected on the second portion of the surface of the substrate. The second portion of the substrate is different from the first portion of the substrate.

According to example embodiments, there may be provided an apparatus for cleaning a substrate. The apparatus may include a cleaning droplet-injecting unit and a protecting liquid-spraying unit. The cleaning droplet-injecting unit may be configured to inject cleaning droplets on to a surface of the substrate. The protecting liquid-spraying unit may be configured to spray a protecting liquid from a first position along a first spray direction, and from a second position along a second spray direction to the surface of the substrate. The first position may be different from the second position.

According to example embodiments, during the cleaning droplets may be injected to the surface of the substrate from a first edge portion of the substrate toward a central portion of the substrate, the protecting liquid may be sprayed from the central portion of the substrate toward the first edge portion of the substrate. In contrast, during the cleaning droplets may be injected to the surface of the substrate from the central portion of the substrate toward a second edge portion of the substrate, the protecting liquid may be sprayed from the central portion of the substrate toward the second edge portion of the substrate. For example, the protecting liquid may be always sprayed from the central portion toward the edge portions in the substrate so that the protecting liquid on the substrate may have a uniform thickness. As a result, efficiency for removing byproducts may be improved, and damage of patterns on the substrate may be reduced.

According to example embodiments, a method includes steps of providing a substrate on a support, spraying a protecting liquid on a first portion of the substrate in a first spray direction, providing a cleaning liquid on the first portion of the substrate, spraying the protecting liquid on a second portion of the substrate in a second spray direction, and providing the cleaning liquid on the second portion of the substrate, wherein the first spray direction comprises a horizontal component in a direction from a center portion of the substrate to a first edge of the substrate, wherein the second spray direction comprises a horizontal component in a direction from the center portion of the substrate to a second edge of the substrate, wherein the second edge of the substrate is opposite the first edge of the substrate, wherein the cleaning liquid cleans the substrate, wherein the protecting liquid protects the substrate from damage by the cleaning liquid.

BRIEF DESCRIPTION OF THE DRAWINGS

Example embodiments will be more clearly understood from the following detailed description taken in conjunction with the accompanying drawings. FIGS. 1 to 18 represent non-limiting, example embodiments as described herein.

FIGS. 1 and 2 are cross-sectional views illustrating an apparatus for cleaning a substrate in accordance with example embodiments;

FIG. 3 is a plan view illustrating the apparatus in FIG. 1;

FIG. 4 is a cross-sectional view illustrating a cleaning droplet-injecting unit of the apparatus in FIG. 1;

FIG. 5 is a graph showing pressure changes by times of the cleaning droplet-injecting unit in FIG. 4;

FIG. 6 is a cross-sectional view illustrating supplying structures of cleaning droplets and a protecting liquid of the apparatus in FIG. 1;

FIG. 7 is a cross-sectional view taken along a line VI-VI' in FIG. 6;

FIGS. 8 to 11 are cross-sectional views illustrating operations for controlling a cleaning droplet-injecting unit and a protecting liquid-spraying unit in accordance with thicknesses of a protecting liquid.

FIG. 12 is a flow chart illustrating a method of cleaning a substrate using the apparatus in FIG. 1;

FIGS. 13 and 14 are cross-sectional views illustrating an apparatus for cleaning a substrate in accordance with example embodiments;

FIG. 15 is a flow chart illustrating a method of cleaning a substrate using the apparatus in FIG. 13;

FIGS. 16 and 17 are cross-sectional views illustrating an apparatus for cleaning a substrate in accordance with example embodiments; and FIG. 18 is a flow chart illustrating a method of cleaning a substrate using the apparatus in FIG. 16.

DETAILED DESCRIPTION

Figure 1:
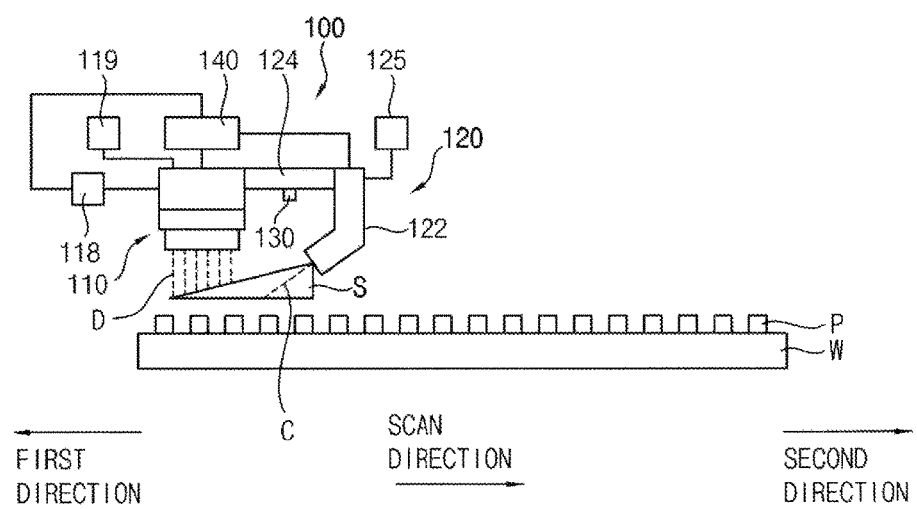

Hereinafter, example embodiments will be explained in detail with reference to the accompanying drawings, in which various embodiments are shown. The invention may, however, be embodied in many different forms and should not be construed as limited to the example embodiments set forth herein. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

In the drawings, like numbers refer to like elements throughout. Though the different figures show various features of exemplary embodiments, these figures and their features are not necessarily intended to be mutually exclusive from each other. Rather, certain features depicted and described in a particular figure may also be implemented with embodiment(s) depicted in different figure(s), even if such a combination is not separately illustrated. Referencing such features/figures with different embodiment labels (e.g. "first embodiment") should not be interpreted as indicating certain features of one embodiment are mutually exclusive of and are not intended to be used with another embodiment.

Unless the context indicates otherwise, the terms first, second, third, etc., are used as labels to distinguish one element, component, region, layer or section from another element, component, region, layer or section (that may or may not be similar). Thus, a first element, component, region, layer or section discussed below in one section of the specification (or claim) may be referred to as a second element, component, region, layer or section in another section of the specification (or another claim).

As used herein, the singular forms "a", "an" and "the" are intended to include the plural forms as well, unless the context clearly indicates otherwise. As used herein, the term "and/or" includes any and all combinations of one or more of the associated listed items and may be abbreviated as "/". With the exception of "consisting of" and "essentially consisting of" it will be further understood that all transition terms describing elements of a step, component, device, etc., are open ended. Thus, unless otherwise specified (e.g., with language such as "only," "without," etc.), the terms "comprising," "including," "having," etc., may specify the presence of stated features, regions, integers, steps, operations, elements, and/or components, but do not preclude the presence or addition of one or more other features, regions, integers, steps, operations, elements, components, and/or groups thereof.

It will be understood that when an element is referred to as being "connected," "coupled to" or "on" another element, it can be directly connected/coupled to/on the other element or intervening elements may be present. In contrast, when an element is referred to as being "directly connected" or "directly coupled" to another element, or as "contacting" or "in contact with" another element, there are no intervening elements present. Spatially relative terms, such as "beneath," "below," "lower," "above," "upper" and the like, may be used herein for ease of description to describe one element's or feature's positional relationship relative to another element(s) or feature(s) as illustrated in the figures. It will be understood that such spatially relative terms are intended to encompass different orientations of the device in use or operation in addition to the orientation depicted in the figures. Thus, a device depicted and/or described herein to have element A below element B, is still deemed to have element A below element B no matter the orientation of the device in the real world.

Embodiments may be illustrated herein with idealized views (although relative sizes may be exaggerated for clarity). It will be appreciated that actual implementation may vary from these exemplary views depending on manufacturing technologies and/or tolerances. Therefore, descriptions of certain features using terms such as "same," "equal," and geometric descriptions such as "planar," "coplanar," "cylindrical," "square," etc., as used herein when referring to orientation, layout, location, shapes, sizes, amounts, or other measures, do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise.

Unless otherwise defined, all terms (including technical and scientific terms) used herein have the same meaning as commonly understood by one of ordinary skill consistent with their meaning in the context of the relevant art and/or the present application.

Figure 2:
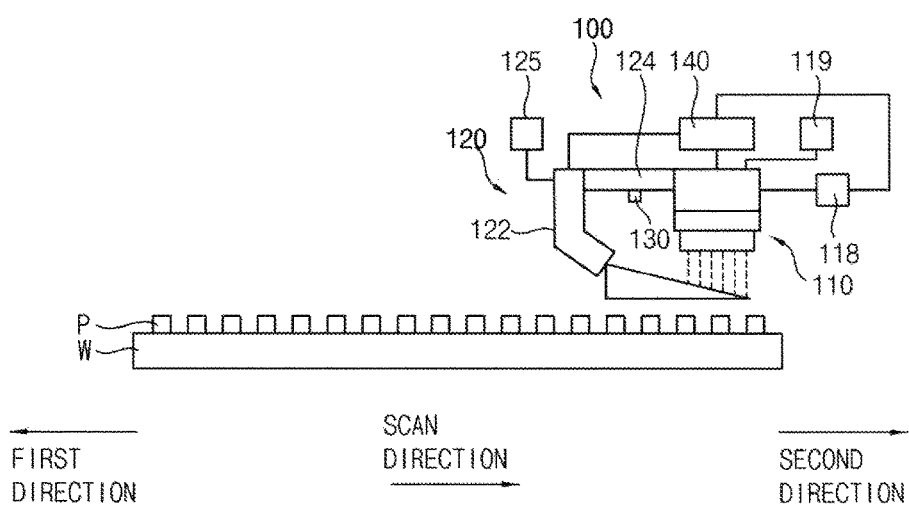
Figure 3:
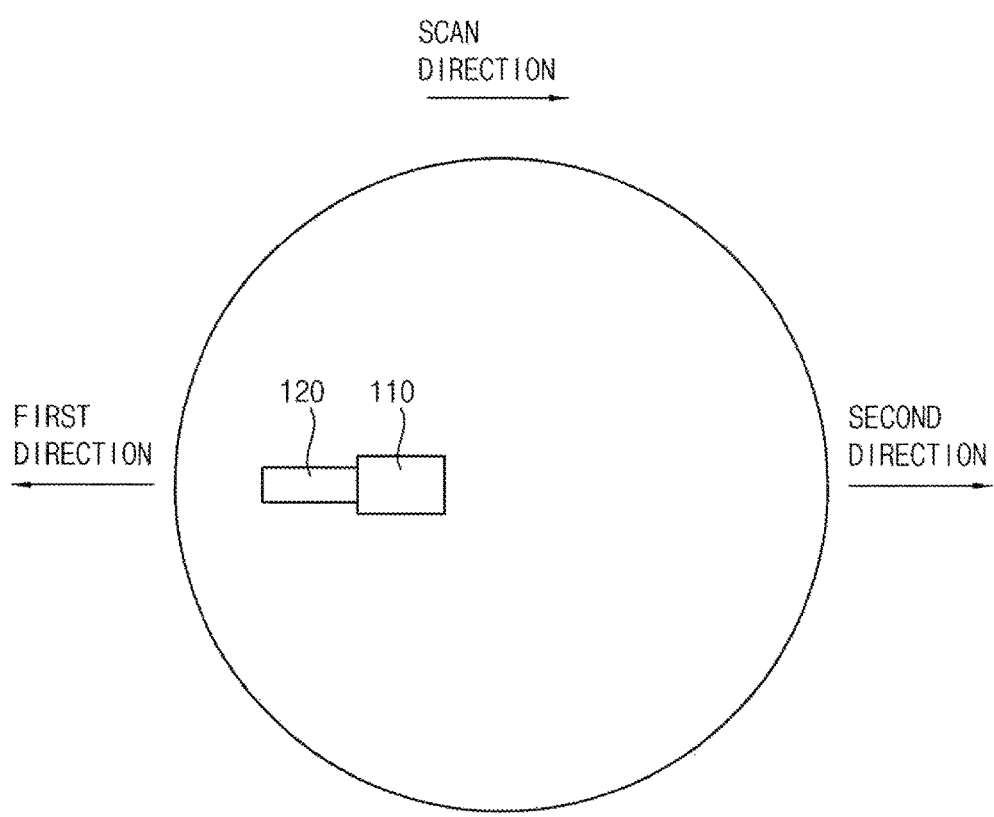
Figure 4:
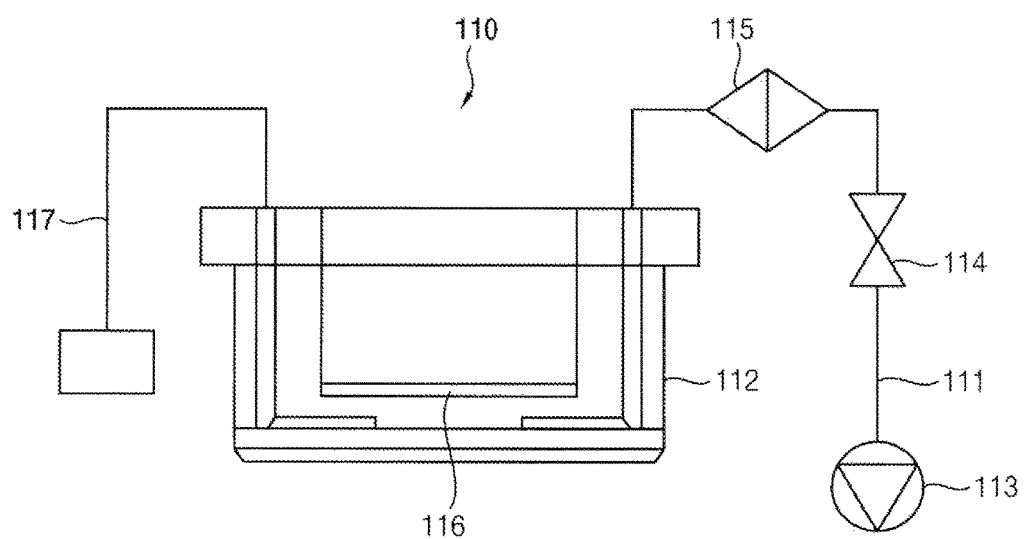
Figure 5:
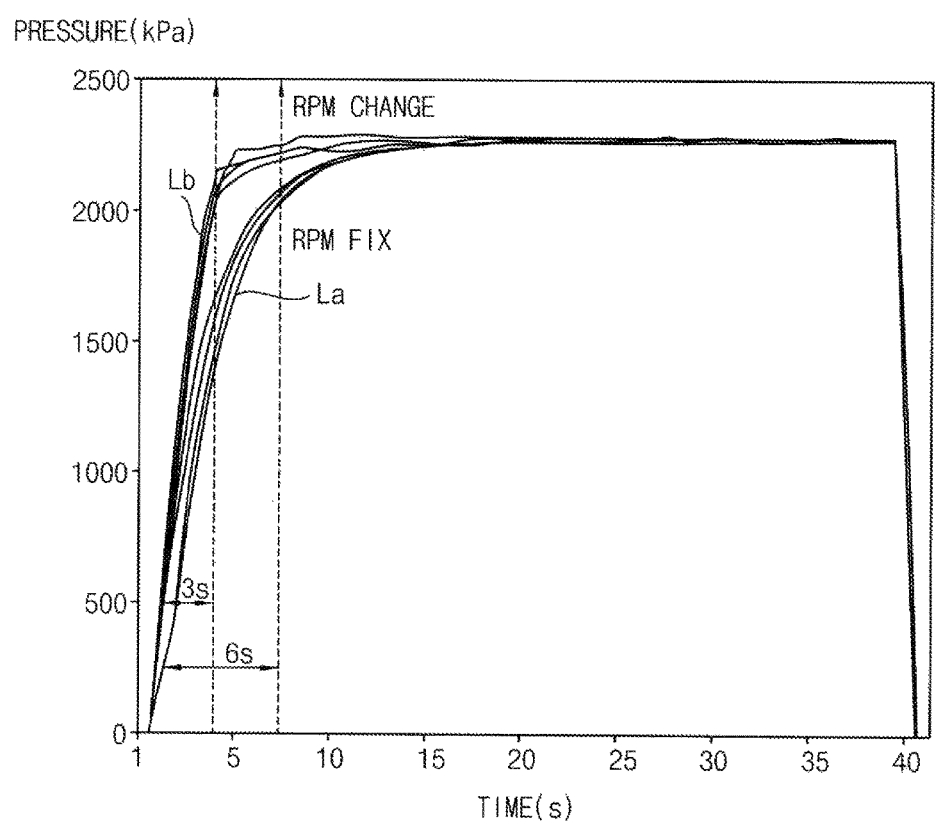
Figure 6:
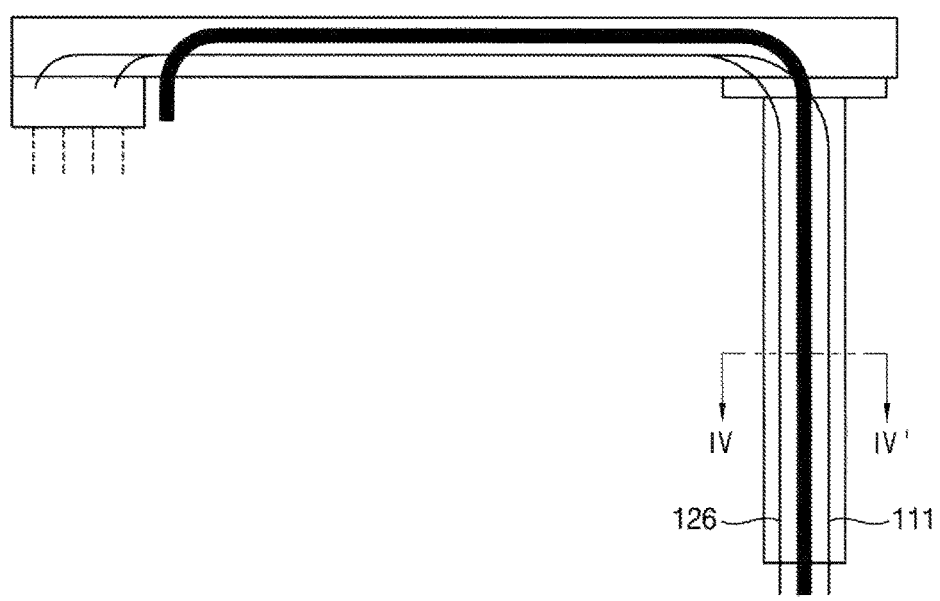
Figure 7:
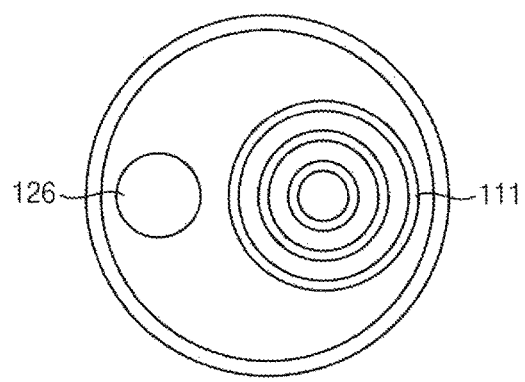

FIGS. 1 and 2 are cross-sectional views illustrating an apparatus for cleaning a substrate in accordance with example embodiments, FIG. 3 is a plan view illustrating the apparatus in FIG. 1, FIG. 4 is a cross-sectional view illustrating a cleaning droplet-injecting unit of the apparatus in FIG. 1, FIG. 5 is a graph showing pressure changes by times of the cleaning droplet-injecting unit in FIG. 4, FIG. 6 is a cross-sectional view illustrating supplying structures of cleaning droplets and a protecting liquid of the apparatus in FIG. 1, FIG. 7 is a cross-sectional view taken along a line VI-VI' in FIG. 6, and FIGS. 8 to 11 are cross-sectional views illustrating operations for controlling a cleaning droplet-injecting unit and a protecting liquid-spraying unit in accordance with thicknesses of a protecting liquid.

Referring to FIG. 1, an apparatus 100 for cleaning a substrate in accordance with example embodiments may include a cleaning droplet-injecting unit 110, a protecting liquid-spraying unit 120, a thickness sensor 130 and a controller 140. The apparatus 100 may include a double feature type apparatus configured to inject cleaning droplets onto an upper surface of the substrate W under a condition that a protecting liquid may be sprayed onto the upper surface of the substrate W to protect patterns P of the substrate W. It will be appreciated that substrate W may be any one of the monolithic structures resulting from one of the many stages of a semiconductor manufacturing process (including intermediate stages and intermediate structures), and may comprise an initial substrate (e.g., semiconductor wafer) or a structure substantially the same as the final semiconductor device(s) formed within and/or on such an initial structure.

Referring to FIG. 3, the cleaning droplet-injecting unit 110 may be configured to inject the cleaning droplets on to the upper surface of the substrate W while the droplet-injecting unit 110 is moved in a direction from a first edge portion of the substrate W to a second edge portion of the substrate W opposite the first edge portion through a central portion of the substrate W, for example, a scan direction of the cleaning droplet-injecting unit 110. The scan direction of the cleaning droplet-injecting unit 110 is the direction of movement of the cleaning droplet-injecting unit 110 relative to the substrate W while the cleaning droplet injecting unit 110 injects cleaning droplets. The injecting of the cleaning droplets may be under pressure to spray the cleaning droplets on to the surface of the substrate from a nozzle of the cleaning droplet injecting unit 110. The nozzle of the cleaning droplet-injecting unit 110 may comprise a shower head comprising a plurality of holes to evenly and uniformly distribute the cleaning fluid over the surface of the substrate W. The protecting liquid-spraying unit 120 may be configured to spray the protecting liquid to the upper surface of the substrate W in at least two directions different from each other.

In example embodiments, the protecting liquid-spraying unit 120 may spray the protecting liquid from a first position to the upper surface of the substrate W in a first spray direction. In the example shown in FIG. 1, the first position is above the substrate W near the left edge of the substrate, between the central portion and the first edge portion of the substrate W. In this example, the first position is right of the cleaning droplet-injecting unit 110.

Unless context indicates otherwise (e.g., when discussion portions of the spray S), "spray direction" as used in this application refers to, with respect to a vertical cross section of the geometric volume of spray S, a direction along a center line intersecting and away from the exit point of the spray S from nozzle 120. In the examples herein, the spray S may be in the form of a cone or prism and thus, the spray direction may be considered the direction away from nozzle 122 along center line C comprising the bisector of the angle of a triangle of the vertical cross section (as shown in FIG. 1) of the cone or prism of spray S at the vertex of such triangle at nozzle 122. The first spray direction may be a direction having an acute angle with respect to a first direction extending from the central portion to the first edge portion of the substrate W. For example, the first spray direction may be a downward direction having an acute angle with respect to the first direction. For example, the first spray direction may be formed by a direction of the protecting liquid spraying nozzle 122 or in a combination of the direction of the protecting liquid spraying nozzle 122 and gravity. In certain embodiments, the first spray direction may extend from above an inner portion of the substrate to an outer portion of the substrate. The spray direction (e.g., a center or the spray) may have a horizontal component in a direction opposite the scan direction (the scan direction is fully horizontal with no vertical component, e.g.) when moving the cleaning droplet injecting unit 110 from the first edge to the center portion. The spray direction may have a horizontal component in a direction that is the same as the scan direction (the scan direction is fully horizontal with no vertical component, e.g.) when moving the cleaning droplet injecting unit 110 from the center portion to the second edge portion. In addition, in some examples, the spray S (e.g., the whole spray) may have no component (e.g., no part, such as at the edge of the spray S) that has a direction with a horizontal component in the direction of the scan direction when moving the cleaning droplet injecting unit 110 from the first edge to the center portion and may have no component that has a direction with a horizontal component in the direction opposite the scan direction when moving the cleaning droplet injecting unit 110 from the center portion to the second edge portion, although the invention is not limited thereto. For example, the right edge of the spray S in FIG. 1 and the left edge of the spray S in FIG. 2 are shown to be vertical (perpendicular to the scan direction) (in other examples, these edges of the spray may have a horizontal component in a direction opposite to those described above with respect to the scan direction. For example, while the cleaning droplet-injecting unit 110 injects the cleaning droplets D continuously from the first edge portion to the central portion of the substrate W, the protecting liquid-spraying unit 120 arranged at the right position of the cleaning droplet-injecting unit 110 may spray the protecting liquid from the first position to a left upper surface of the substrate W in the first spray direction.

The protecting liquid-spraying unit 120 may spray the protecting liquid from a second position different from the first position to the upper surface of the substrate W in a second spray direction different from the first spray direction. The second position in this example is above the substrate W on the right side of the substrate W between the central portion and the second edge portion of the substrate W (as shown in FIG. 2). For example, the second position may be a left position of the cleaning droplet-injecting unit 110. The second spray direction may be a direction having an acute angle with respect to a second direction extending from the central portion to the second edge portion of the substrate W. In certain embodiments, the second spray direction may extend from above an inner portion of the substrate to an outer portion of the substrate. For example, the first and second spray directions may be center portion directions of the spray of the protecting liquid. For example, the spray of the protecting liquid may have a triangular vertical cross-sectional view as shown in FIGS. 1 and 2. For example, the spray of the protecting liquid may have a cone shape or another three-dimensional shape. For example, a horizontal cross-sectional view of the spray may have a circular, elliptical, square, rectangular, or another polygonal shape. For example, the second spray direction may be formed by a direction of the protecting liquid spraying nozzle 122 or in a combination of the direction of the protecting liquid spraying nozzle 122 and gravity. For example, during the cleaning droplet-injecting unit 110 may inject the cleaning droplets D from the central portion to the first edge portion of the substrate W, the protecting liquid-spraying unit 120 arranged at the left position of the cleaning droplet-injecting unit 110 may spray the protecting liquid from the second position to a right upper surface of the substrate W in the second spray direction.

In example embodiments, the first direction may be opposite to the second direction. For example, the first and second spray directions may have symmetry with respect to a vertical line passing through a center portion of the substrate W. The first direction may be opposite to the scan direction of the cleaning droplet-injecting unit 110. The second direction may correspond to the scan direction of the cleaning droplet-injecting unit 110. Alternatively, the first direction may not be opposite to the second direction. The second direction may not correspond to the scan direction of the cleaning droplet-injecting unit 110.

Referring to FIG. 1, the cleaning droplet-injecting unit 110 may be arranged over the substrate W. The substrate W may include the patterns P. The patterns P may be formed on the upper surface of the substrate W by an exposing process. Byproducts generated in the exposing process may be adhered to the patterns P and/or the substrate W. The substrate W may include a semiconductor substrate, a glass substrate, etc. The patterns P may include a photoresist pattern.

The cleaning droplet-injecting unit 110 may inject the cleaning droplets D to the upper surface of the substrate W to remove the byproducts. For example, the cleaning droplets may dissolve the byproducts. For example, the cleaning droplets D may decompose a portion of the byproducts. For example, the cleaning droplets D may include a surfactant. In example embodiments, the cleaning droplets may include a deionized water containing carbon dioxide. Alternatively, the cleaning droplets may be changed in accordance with kinds of the byproducts.

Referring to FIG. 4, the cleaning droplet-injecting unit 110 may include a cleaning droplet-injecting nozzle 112, a cleaning droplet-supplying line 111, a pump 113, a valve 114, a filter 115, a piezoelectric element 116, and a drain line 117. The cleaning droplet-injecting unit 110 may be moved by a vertical actuator 118 and a horizontal actuator 119 shown in FIG. 1.

The cleaning droplet-injecting nozzle 112 may be arranged over the upper surface of the substrate W. The cleaning droplet-injecting nozzle 112 may have a plurality of injecting holes configured to inject the cleaning droplets D to the upper surface of the substrate W. The injecting holes may be arranged at a lower surface of the cleaning droplet-injecting nozzle 112. For example, the cleaning droplets D may be injected from the cleaning droplet-injecting nozzle 112 to the upper surface of the substrate W in a direction substantially perpendicular to the upper surface of the substrate W.

The pump 113 may be connected with the cleaning droplet-injecting nozzle 112 via the cleaning droplet-supplying line 111. The valve 114 may be arranged between the cleaning droplet-injecting nozzle 112 and the pump 113 to control flows of the cleaning droplets. The filter 115 may be arranged between the cleaning droplet-injecting nozzle 112 and the valve 114 to remove foreign substances in the cleaning droplets. The drain line 117 may be connected to the cleaning droplet-injecting nozzle 112. The cleaning droplets, which may not be injected to the upper surface of the substrate W, may be drained through the drain line 117.

The piezoelectric element 116 may be arranged in the cleaning droplet-injecting nozzle 112. The piezoelectric element 116 may apply vibrations to a cleaning liquid in the cleaning droplet-injecting nozzle 112 to convert the cleaning liquid into the cleaning droplets. The cleaning droplets may be injected to the upper surface of the substrate W through the injecting holes.

A detergency for removing the byproducts from the substrate W may be determined by a pressure and a speed of the cleaning droplets. When the pressure of the cleaning droplet is high, the pattern P may be damaged by the cleaning droplet. In contrast, when the pressure of the cleaning droplet is low, the detergency may be decreased. Because a size of the cleaning droplet may be proportional to the pressure of the cleaning droplet, the cleaning droplet may have a proper size so as to prevent the above-mentioned problems. When the speed of the cleaning droplet is fast, the pattern P may be damaged by the cleaning droplet. In contrast, when the speed of the cleaning droplet is slow, the detergency may be decreased. An interval between the cleaning droplets may determine the detergency. For example, when the interval between the cleaning droplets is narrow or the sizes of the cleaning droplets are different from each other, the adjacent cleaning droplets may be stuck with each other to form a larger cleaning droplet than other cleaning droplets. Because the large cleaning droplet may have a pressure higher than that of other cleaning droplets, the large cleaning droplet may damage the pattern P.

The size and the speed of the cleaning droplet may be determined by a pressure of the cleaning fluid in the cleaning droplet-injecting nozzle 112 and a frequency of the piezoelectric element 116. In order to improve the detergency, it may be beneficial to match the pressure of the cleaning liquid with the frequency of the piezoelectric element 116.

The pressure of the cleaning liquid may be determined by an RPM of the pump 113. During the pump 113 is initially driven, the pressure of the cleaning liquid may be lower than a set pressure of the cleaning liquid. For example, when the pump 113 starts to rotate and/or for some time after the pump 113 starts to rotate, the pressure of the cleaning liquid may be lower than a predetermined pressure of the cleaning liquid with which the cleaning droplet injecting unit 110 normally operates. The low pressure of the cleaning liquid may not match the frequency of the piezoelectric element 116. For example, a combination of the low pressure of the cleaning liquid and the frequency of the piezoelectric element 116 may not produce a proper size and/or a proper speed of the cleaning droplets. In order to match the pressure of the cleaning liquid with the frequency of the piezoelectric element 116, the pump 113 may have two RPMs. For example, two different rotation rates of the pump 113 may be used to inject constant or improved size and speed of cleaning droplets. For example, the pump 113 may rotate to inject the cleaning droplets with a first rotation rate when the pump 113 starts to rotate, and the pump 113 may rotate to inject the cleaning droplets with a second rotation rate lower than the first rotation rate after a predetermined time from the time that the pump 113 start to rotate.

In FIG. 5, a curved line La may represent pressure changes of the cleaning liquid without RPM change, e.g., a constant RPM, of the pump 113. It can be noted that a time for providing the cleaning liquid with the set pressure may be about 6 seconds from the initial drive of the pump 113. For example, the pressure of the cleaning liquid may not match the frequency of the piezoelectric element 115 for about 6 seconds from the initial drive of the pump 113, and may generate the above-mentioned problems. The matching time may depend on a rotation rate of the pump 113 and/or a frequency of the piezoelectric element 115 of the cleaning droplet injecting unit 110, and may range between 5 and 7 seconds in certain examples. The matching time may range between 3 and 9 seconds in certain embodiments.

According to example embodiments, the RPM of the pump 113 in an initial drive may be set faster than a set RPM of the pump 113. For example, the set RPM may be a predetermined RPM with which the pump 113 is operated in a stable state cleaning a substrate. When the pressure of the cleaning liquid approaches to the set pressure, the RPM of the pump 113 may be decreased to the set RPM. In FIG. 5, a curved line Lb may represent pressure changes of the cleaning liquid with RPM changes of the pump 113. It can be noted that a time for providing the cleaning liquid with the set pressure may be about 3 seconds from the initial drive of the pump 113. For example, the pressure of the cleaning liquid may not match the frequency of the piezoelectric element 115 for about 3 seconds from the initial drive of the pump 113. The matching time may depend on a cleaning droplet injecting unit 110, and may be less than 5 seconds in certain cleaning droplet injecting unit 10. The matching time may be less than 3 seconds in certain examples.

Therefore, the mismatch time between the pressure of the cleaning liquid and the frequency of the piezoelectric element 116 may be decreased by setting the two different RPMs of the pump 113 sequentially. As a result, damage of the patterns P, which may be caused by the mismatch between the pressure of the cleaning liquid and the frequency of the piezoelectric element 116, may be reduced.

Referring to FIGS. 6 and 7, the cleaning droplet-supplying line 111 may be arranged adjacent to a protecting liquid-supplying line 126. For example, a temperature of the cleaning liquid in the cleaning droplet-supplying line 111 may be affected by a temperature of the protecting liquid in the protecting liquid-supplying line 126. The temperature of the protecting liquid may be higher than the temperature of the cleaning liquid. For example, the temperature of the cleaning liquid may be increased due to the temperature of the protecting liquid so that the pressure of the cleaning liquid may be higher than the set temperature. A cleaning liquid having a high pressure and/or a high temperature may damage the pattern P.

In order to minimize a heat exchange between the cleaning liquid and the protecting liquid, the cleaning droplet-supplying line 111 may have a multi-layered tubular shape. In example embodiments, the cleaning droplet-supplying line 111 may have a three-layered tubular shape. Alternatively, the cleaning droplet-supplying line 111 may have a two-layered tubular shape or at least four-layered tubular shape. The cleaning droplet-supplying line 111 may have a single tubular shape surrounded by an adiabatic layer. The protecting liquid-supplying line 126 may have a multi-layered tubular shape or a single tubular shape surrounded by an adiabatic layer. The cleaning droplet supplying line 111 and the protecting liquid supplying line 126 may be positioned away from each other. For example, a distance between the cleaning droplet supplying line 111 and the protecting liquid supplying line 126 may be greater than at least one of the diameters of the cleaning droplet supplying line 111 and the protecting liquid supply line 126. For example, a distance between the cleaning droplet supplying line 111 and the protecting liquid supplying line 126 may be greater than both of the diameters of the cleaning droplet supplying line 111 and the protecting liquid supply line 126.

The horizontal actuator 118 may move the cleaning droplet-injecting nozzle 112 in a horizontal direction, for example, the scan direction. The vertical actuator 119 may move the cleaning droplet-injecting nozzle 112 in a vertical direction, for example, a perpendicular direction to the scan direction.

Referring to FIG. 1, the protecting liquid-spraying unit 120 may spray the protecting liquid to the upper surface of the substrate W to cover the pattern P of the substrate W with the protecting liquid. The protecting liquid may have a substantially uniform thickness throughout an upper surface of the substrate W. The protecting liquid-spraying unit 120 may continuously spray the protecting liquid to the upper surface of the substrate W during the cleaning droplet-injecting unit 110 injects the cleaning droplets to the upper surface of the substrate W. For example, the protecting liquid may protect patterns P on the substrate W from damage chemically and/or mechanically. For example, the protecting liquid may attenuate the concentration of the cleaning droplets. For example, the protecting liquid may neutralize the cleaning droplets. The protecting liquid may include SC-1, isopropyl alcohol (IPA), ammonia water, etc. The protecting liquid may include deionized water.

The protecting liquid-spraying unit 120 may be rotatably connected with the cleaning droplet-injecting unit 110. The protecting liquid-spraying unit 120 may be rotated with the cleaning droplet-injecting unit 110 in accordance with positions of the cleaning droplet-injecting unit 110. For example, the protecting liquid-spraying unit 120 may be rotationally moved from the first position right of the cleaning droplet-injecting unit 110 to the second position left of the cleaning droplet-injecting unit 110. In certain embodiments, the protecting liquid-spraying unit 120 may be rotationally moved from the second position left of the cleaning droplet-injecting unit 110 to the first position right of the cleaning droplet-injecting unit 110. For example, the protecting liquid-spraying unit 120 may spray the protecting liquid to the left upper surface of the substrate W from the first position in the first spray direction. For example, the protecting liquid-spraying unit 120 may spray the protecting liquid to the right upper surface of the substrate W from the second position in the second spray direction. In certain embodiments, the protecting liquid spraying unit 120 may be configured to spray the protecting liquid on an opposite surface of the substrate W with respect to the center portion surface of the substrate W. For example, the protecting liquid spraying unit 120 may be configured to spray the protecting liquid across the center portion surface of the substrate W.

The protecting liquid-spraying unit 120 may include a protecting liquid-spraying nozzle 122, a nozzle arm 124, a protecting liquid-supplying line 126 and an actuator 125. The protecting liquid-supplying line 126 may be connected with the protecting liquid-spraying nozzle 122 through the nozzle arm 124.

The nozzle arm 124 may have an inner end and an outer end. The inner end of the nozzle arm 124 may be rotatably connected to the cleaning droplet-injecting nozzle 112. For example, the inner end of the nozzle arm 124 may be rotatably connected to the cleaning droplet-injecting nozzle 112, and the nozzle arm 124 may be configured to rotate with respect to a vertical axis substantially perpendicular to the upper surface of the substrate W.

The outer end of the nozzle arm 124 may extend horizontally from the inner end of the nozzle arm 124. The protecting liquid-spraying nozzle 122 may be connected and/or fixed to the outer end of the nozzle arm 124. The protecting liquid-spraying nozzle 122 may extend slantly from the outer end of the nozzle arm 124 to the upper surface of the substrate W. For example, the protecting liquid spraying nozzle 122 may slant downward from the outer end of the nozzle arm 124. The protecting liquid-spraying nozzle 122 may incline to the upper surface of the substrate W at an acute angle. For example, the acute angle may be about 20° to about 60°. The acute angle may be an angle between the protecting liquid spraying nozzle 122 and the upper surface of the substrate W. For example, the protecting liquid may be slantly sprayed from the protecting liquid-spraying nozzle 122 to the upper surface of the substrate W.

Referring to FIG. 1, the protecting liquid-spraying nozzle 122 may be positioned right of the cleaning droplet-injecting nozzle 112. The protecting liquid-spraying nozzle 122 may spray the protecting liquid to the left upper surface of the substrate W in the first spray direction. For example, the protecting liquid-spraying nozzle 122 may continuously spray the protecting liquid from the central portion of the substrate W to the first edge portion of the substrate W, e.g., in the first spray direction while the cleaning droplet-injecting nozzle 112 injects the cleaning droplets from the first edge portion of the substrate W to the central portion of the substrate W. For example, because the protecting liquid-spraying nozzle 122 may continuously spray the protecting liquid from the central portion of the substrate W to the first edge portion of the substrate W while the cleaning droplet-injecting nozzle 112, injecting cleaning droplets, moves from the first edge portion of the substrate W to the central portion of the substrate W, the protecting liquid on the first edge portion of the substrate W may have a sufficient thickness for protecting the pattern P. In certain embodiments, the protecting liquid spraying nozzle 122 may spray the protecting liquid to the upper surface of the substrate W across the center portion of the upper surface of the substrate W.

When the protecting liquid-spraying nozzle 122 is positioned at a region right of the cleaning droplet-injecting nozzle 112 while the cleaning droplet-injecting nozzle 112 injects the cleaning droplets to the second edge portion of the substrate W, a great amount of the protecting liquid sprayed from the protecting liquid-spraying nozzle 122 may be sprayed to a side surface of the substrate W, not the upper surface on the second edge portion of the substrate W. In order to prevent the protecting liquid from being sprayed to the side surface of the substrate W, the actuator 125 may rotate the protecting liquid-spraying nozzle 122 with respect to the vertical axis. In certain embodiments, the protecting liquid spraying nozzle 122 may be rotated with respect to a center portion of the cleaning droplet injecting nozzle 112. In certain embodiments, the protecting liquid may be sprayed on the substrate W across the center portion of the substrate W.

Referring to FIG. 2, when the cleaning droplet-injecting nozzle 112 is positioned at the central portion of the substrate W, the actuator 125 may rotate the protecting liquid-spraying nozzle 122 by an angle of about 180° with respect to the vertical axis. For example, the protecting liquid-spraying nozzle 122 may be positioned at a region left of the cleaning droplet-injecting nozzle 112 to spray the protecting liquid to the upper surface of the substrate W in the second spray direction. For example, while the cleaning droplet-injecting nozzle 112 injects the cleaning droplets from the central portion of the substrate W to the second edge portion of the substrate W, the protecting liquid-spraying nozzle 122 may continuously spray the protecting liquid from the central portion of the substrate W to the second edge portion of the substrate W. Therefore, because the protecting liquid-spraying nozzle 122 may continuously spray the protecting liquid from the central portion of the substrate W to the second edge portion of the substrate W while the cleaning droplet-injecting nozzle 112 moves from the central portion of the substrate W to the second edge portion of the substrate W, the protecting liquid on the second edge portion of the substrate W may have a sufficient thickness for protecting the pattern P.

The protecting liquid sprayed from the protecting liquid-spraying unit 120 may have a uniform thickness for covering the pattern P. In certain cases, the protecting liquid on the pattern P may not have a uniform thickness locally. For example, when the protecting liquid on any one of the patterns P may have a thickness substantially thinner than that of the protecting liquid on other patterns P, the pattern P under the thin protecting liquid may be damaged by the pressure of the cleaning droplets. In contrast, when the protecting liquid on any one of the patterns P may have a thickness substantially thicker than that of the protecting liquid on other patterns P, the byproducts on the pattern P under the thick protecting liquid may not be removed by the cleaning droplets.

In order to solve the above-mentioned problems, the thickness sensor 130 may measure thicknesses of the protecting liquid on the patterns P. The thickness sensor 130 may be attached to a lower surface of the nozzle arm 124. For example, the thickness sensor 130 may measure the thicknesses of the protecting liquid on the patterns P with being moved together with nozzle arm 124. The thickness sensor 130 may include an electromagnetism type sensor, a radiation type sensor, a microwave type sensor, etc.

The controller 140 may control operations of the cleaning droplet-injecting unit 110 and/or the protecting liquid-spraying unit 120 in accordance with the thicknesses of the protecting liquid measured by the thickness sensor 130. The controller 140 may control an injection height of the cleaning droplet-injecting unit 110 from the upper surface of the substrate W. The controller 140 may control a spray flux of the protecting liquid-spraying unit 120. In certain embodiments, the controller 140 may control the operations of the vertical actuator as well as the operations of the cleaning droplet-injecting unit 110 and the protecting liquid-spraying unit 120.

Figure 8:
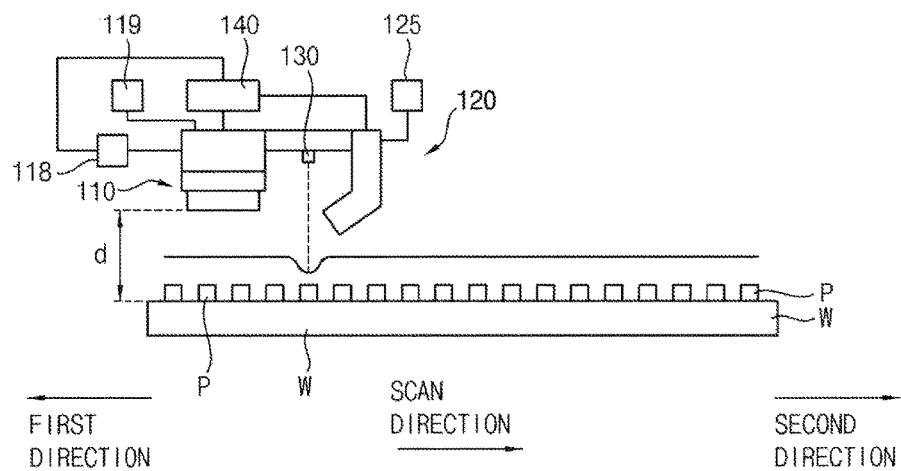

Referring to FIG. 8, the cleaning droplet-injecting nozzle 112 may be spaced apart from the upper surface of the substrate W by a distance d. A thickness of the protecting liquid on a pattern P may be substantially thinner than a thickness of the protecting liquid on another pattern P. The pattern P under the thin protecting liquid may be damaged by the pressure of the cleaning droplets. The thickness sensor 130 may measure the thickness of the thin protecting liquid. The measured thickness may be transmitted to the controller 140.

Figure 9:
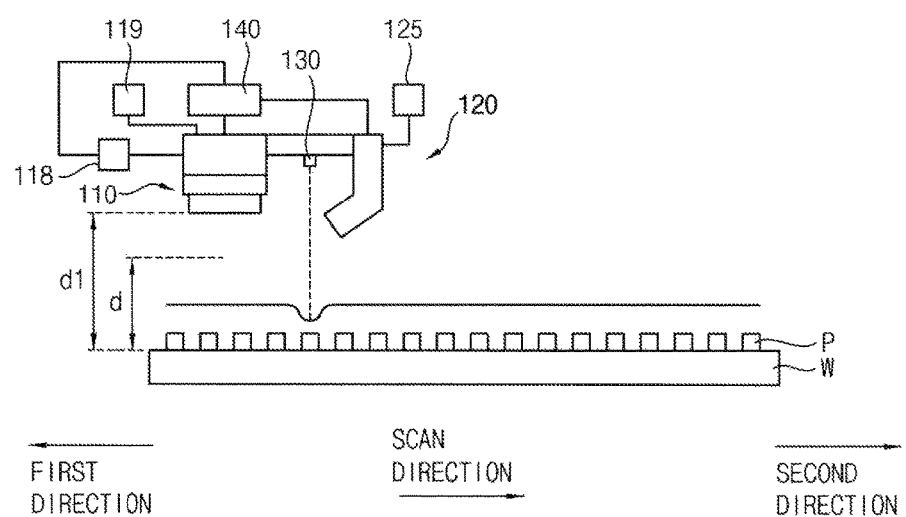

Referring to FIG. 9, the controller 140 may drive the vertical actuator 119. The vertical actuator 119 may upwardly move the cleaning droplet-injecting nozzle 112. For example, by moving the cleaning droplet injecting nozzle 112 upwardly, a distance d1 between the cleaning droplet-injecting nozzle 112 and the upper surface of the substrate W may be longer than the set distance d. As a result, the pressure of the cleaning droplets applied from the cleaning droplet-injecting nozzle 112 to the pattern P may be decreased. Alternatively, the controller 140 may control the protecting liquid-spraying unit 120 to increase the spray flux of the protecting liquid from the protecting liquid-spraying nozzle 122 while the cleaning droplet-injecting nozzle 112 maintains its height and/or position. In certain embodiments, the controller 140 may upwardly move the cleaning droplet-injecting nozzle 112 simultaneously with the increasing of the spray flux of the protecting liquid.

Figure 10:
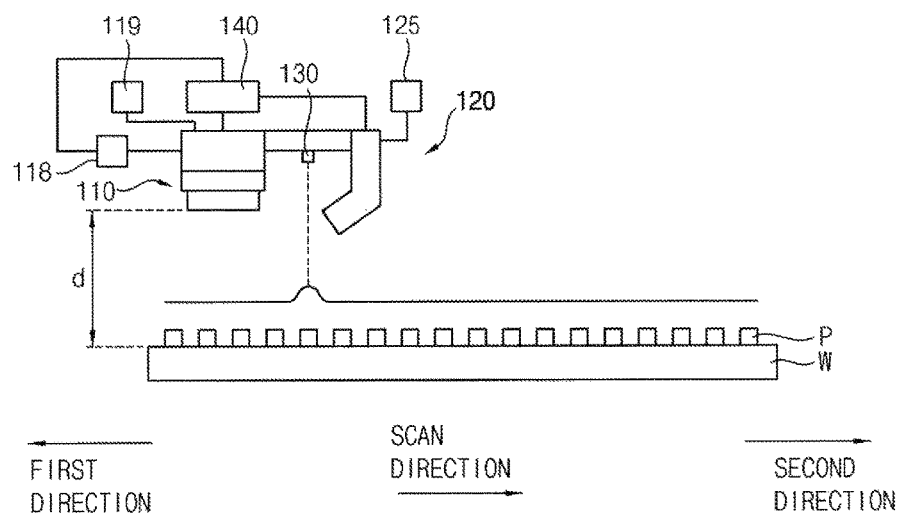

In certain embodiments, referring to FIG. 10, a thickness of the protecting liquid on a pattern P may be substantially thicker than a thickness of the protecting liquid on another pattern P that may have a proper thickness for a cleaning process. The byproducts adhered to the pattern P under the substantially thicker protecting liquid may not be removed by the cleaning droplets. The thickness sensor 130 may measure the thickness of the protecting liquid including the substantially thicker protecting liquid. The measured thickness may be transmitted to the controller 140.

Figure 11:
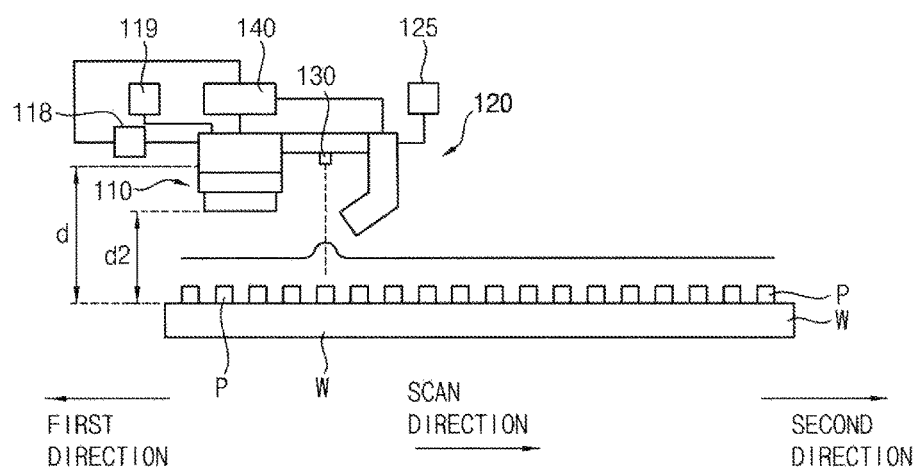

Referring to FIG. 11, the controller 140 may drive the vertical actuator 119. The vertical actuator 119 may downwardly move the cleaning droplet-injecting nozzle 112. For example, by moving the cleaning droplet injecting nozzle 112 downwardly, a distance d2 between the cleaning droplet-injecting nozzle 112 and the upper surface of the substrate W may be shorter than the set distance d. As a result, the pressure of the cleaning droplets applied from the cleaning droplet-injecting nozzle 112 to the pattern P may be increased. Alternatively, the controller 140 may control the protecting liquid-spraying unit 120 to decrease the spray flux of the protecting liquid from the protecting liquid-spraying nozzle 122 while the cleaning droplet-injecting nozzle 112 maintains its height and/or position. In certain embodiments, the controller 140 may downwardly move the cleaning droplet-injecting nozzle 112 simultaneously with the decreasing of the spray flux of the protecting liquid.

Figure 12:
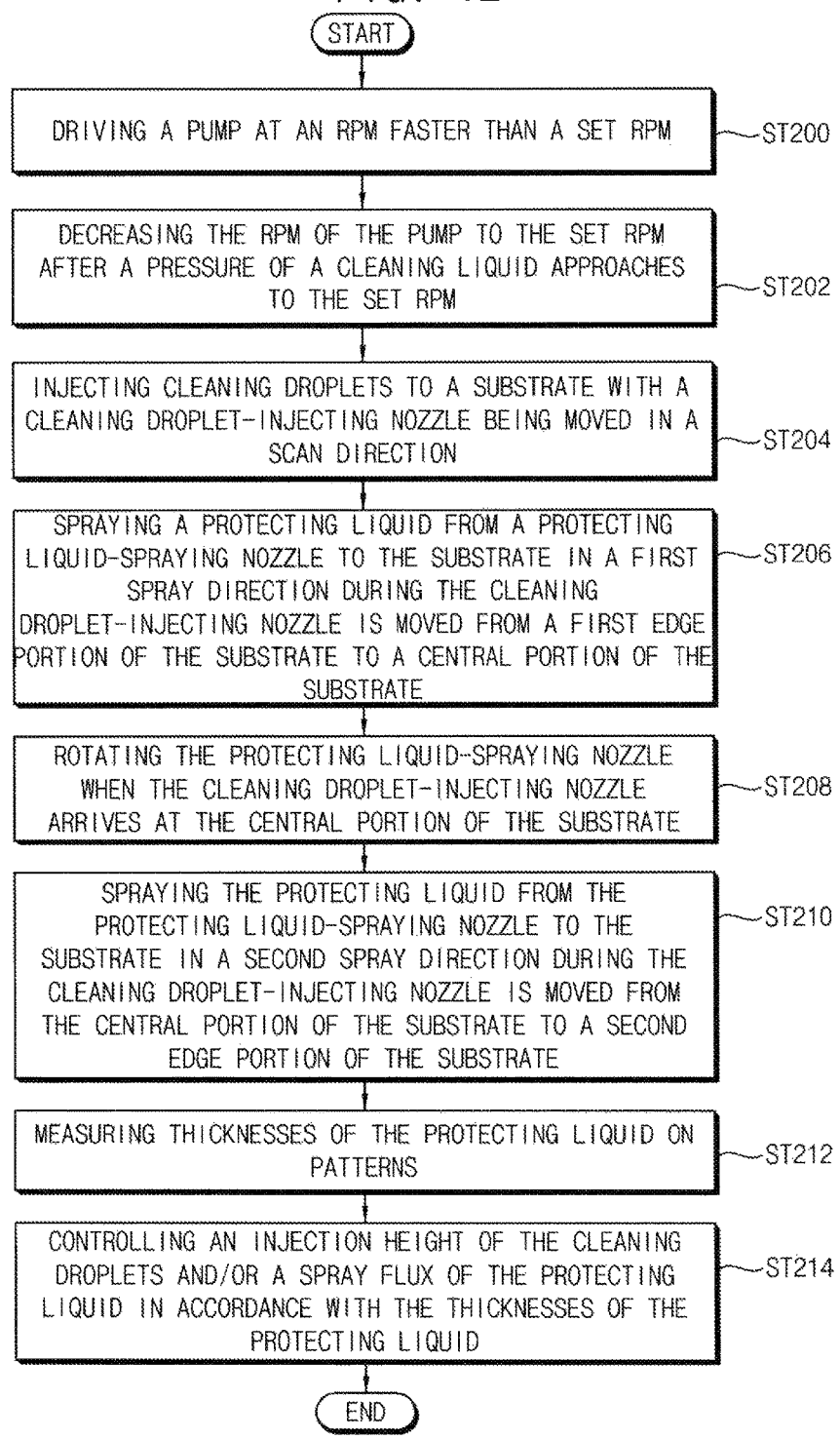

FIG. 12 is a flow chart illustrating a method of cleaning a substrate using the apparatus in FIG. 1.

Referring to FIGS. 1, 2 and 12, in step ST200, the pump 113 may be driven at an RPM faster than the set RPM.

In step ST202, when the pressure of the cleaning liquid may approach to the set pressure, the RPM of the pump 113 may be decreased to the set RPM. The mismatch time between the pressure of the cleaning liquid and the frequency of the piezoelectric element 116 may be decreased by controlling the RPM of the pump 113. As a result, the damage of the patterns P caused by the mismatch between the pressure of the cleaning liquid and the frequency of the piezoelectric element 116 may be reduced.

In step ST204, the cleaning droplet-injecting nozzle 112 may inject the cleaning droplets to the upper surface of the substrate W while the cleaning droplet injecting nozzle 122 moves from the first edge portion of the substrate W to the second edge portion of the substrate W through the central portion of the substrate W.

In step ST206, while the cleaning droplet-injecting nozzle 112 moves from the first edge portion of the substrate W to the central portion of the substrate W, the protecting liquid-spraying nozzle 122 positioned right of the cleaning droplet-injecting nozzle 112 may spray the protecting liquid to the upper surface of the substrate in the first spray direction, e.g., from above the central portion of the substrate W to the first edge portion of the substrate W.

In step ST208, when the cleaning droplet-injecting nozzle 112 is positioned at the central portion of the substrate W, the actuator 125 may rotate the protecting liquid-spraying nozzle 122 at an angle of about 180°. For example, the protecting liquid-spraying nozzle 122 may be moved to and positioned left of the cleaning droplet-injecting nozzle 112 by an operation of the actuator 125 when the cleaning droplet injecting nozzle 112 arrives at the central portion of the substrate W.

In step ST210, while the cleaning droplet-injecting nozzle 112 moves from the central portion of the substrate W to the second edge portion of the substrate W, the protecting liquid-spraying nozzle 122 positioned left of the cleaning droplet-injecting nozzle 112 may spray the protecting liquid to the upper surface of the substrate in the second spray direction, e.g., from above the central portion of the substrate W to the second edge portion of the substrate W.

Therefore, because the protecting liquid may always be sprayed from the central portion of the substrate W to the edge portions of the substrate W, the protecting liquid on the edge portions of the substrate W may be sufficiently thick. As a result, the patterns P on the edge portions of the substrate W may not be damaged.

In step ST212, the thickness sensor 130 may measure the thicknesses of the protecting liquid on the patterns P while the protecting liquid-spraying nozzle 122 sprays the protecting liquid.

In step ST214, the controller 140 may control the cleaning droplet-injecting nozzle 112 and/or the protecting liquid-spraying nozzle 122 in accordance with the measured thicknesses of the protecting liquid by regions. The controller 140 may control the injection height of the cleaning droplet-injecting nozzle 112 and/or the spray flux of the protecting liquid.

Therefore, the detergency may be improved, and the damage of the patterns P may be reduced by controlling the cleaning droplet-injecting nozzle 112 and/or the protecting liquid-spraying nozzle 122 in accordance with the thicknesses of the protecting liquid.

Figure 13:
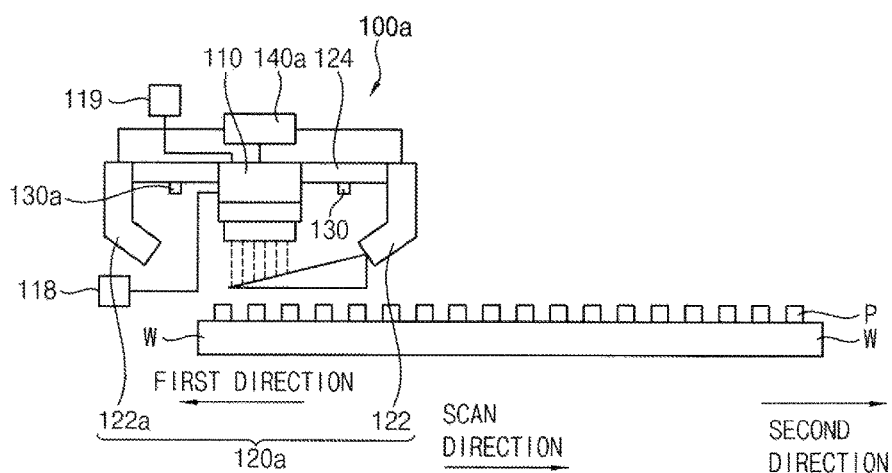
Figure 14:
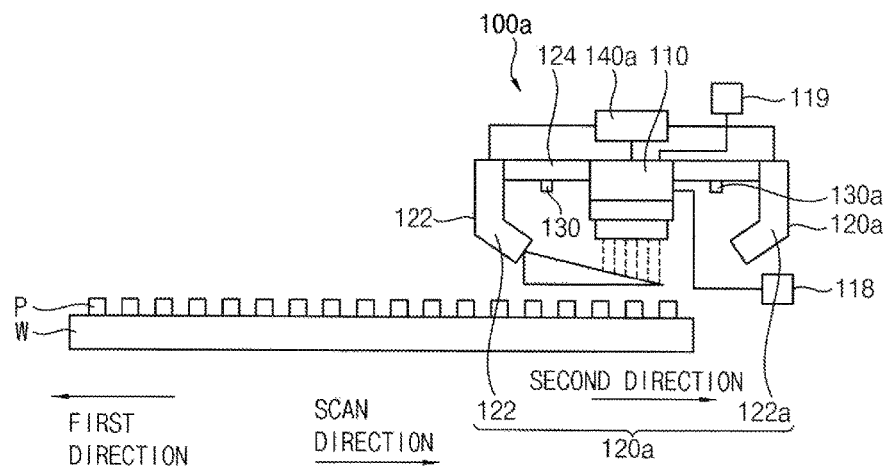

FIGS. 13 and 14 are cross-sectional views illustrating an apparatus for cleaning a substrate in accordance with example embodiments.

Referring to FIGS. 13 and 14, an apparatus 100a for cleaning a substrate in accordance with example embodiments may include a cleaning droplet-injecting unit 110, a protecting liquid-spraying unit 120a, a first thickness sensor 130, a second thickness sensor 130a and a controller 140a.

The cleaning droplet-injecting unit 110 in FIG. 13 may have a structure and functions substantially the same as those of the cleaning droplet-injecting unit 110 in FIG. 1. Thus, any further illustrations with respect to the cleaning droplet-injecting unit 110 may be omitted herein for brevity.

The protecting liquid-spraying unit 120a may include a first protecting liquid-spraying nozzle 122 and a second protecting liquid-spraying nozzle 122a. The first protecting liquid-spraying nozzle 122 may be positioned at a region right of the cleaning droplet-injecting unit 110. The second protecting liquid-spraying nozzle 122a may be positioned at a region left of the cleaning droplet-injecting unit 110. The first protecting liquid-spraying nozzle 122 may be connected and/or fixed to the cleaning droplet-injecting nozzle 112. The second protecting liquid-spraying nozzle 122a may be connected and/or fixed to the cleaning droplet-injecting nozzle 112. The controller 140a may selectively control operations of the first and second protecting liquid-spraying nozzles 122 and 122a in accordance with positions of the cleaning droplet-injecting nozzle 112.

While the cleaning droplet-injecting nozzle 112 moves from the first edge portion of the substrate W to the central portion of the substrate W, the controller 140a may drive only the first protecting liquid-spraying nozzle 122. For example, the first protecting liquid-spraying nozzle 122 positioned right of the cleaning droplet-injecting nozzle 112 may spray the protecting liquid in the first spray direction, e.g., from above the central portion of the substrate W toward the first edge portion of the substrate W.

When the cleaning droplet-injecting nozzle 112 arrives at the central portion of the substrate W, the controller 140a may stop spraying protecting liquid from the first protecting liquid-spraying nozzle 122. In contrast, the controller 140a may drive the second protecting liquid-spraying nozzle 122a to spray protecting liquid. Thus, while the cleaning droplet-injecting nozzle 112 moves from the central portion of the substrate W to the second edge portion of the substrate W, the second protecting liquid-spraying nozzle 122 positioned left of the cleaning droplet-injecting nozzle 112 may spray the protecting liquid in the second spray direction, e.g., from above the central portion of the substrate W toward the second edge portion of the substrate W.

The first thickness sensor 130 may be attached to the first protecting liquid-spraying nozzle 122. The second thickness sensor 130a may be attached to the second protecting liquid-spraying nozzle 122a. The first thickness sensor 130 may measure thicknesses of the protecting liquid on a portion of the patterns P formed from the first edge portion of the substrate W to the central portion of the substrate W.

The second thickness sensor 130a may measure thicknesses of the protecting liquid on a portion of the patterns P formed from the central portion of the substrate W to the second edge portion of the substrate W.

Figure 15:
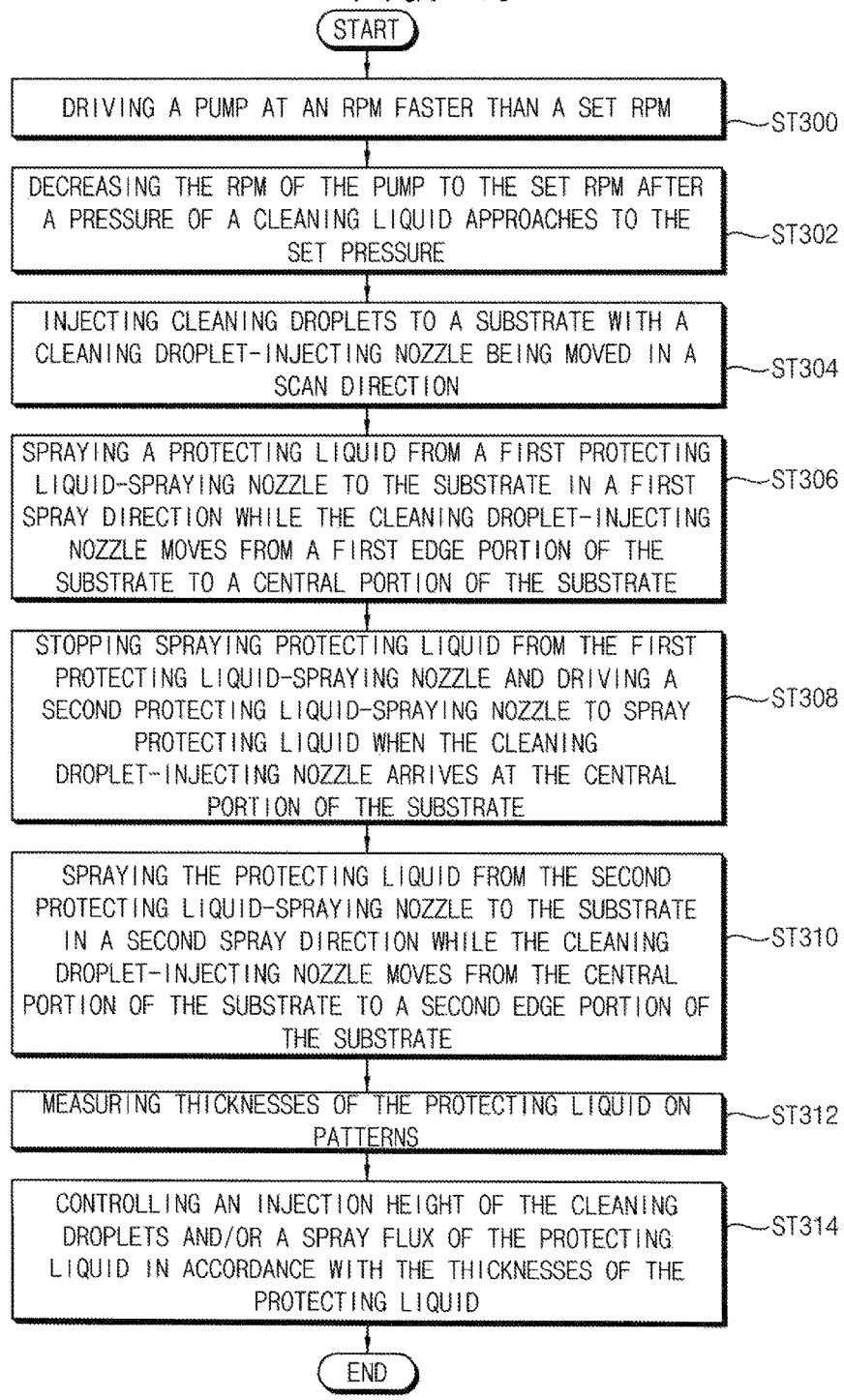

FIG. 15 is a flow chart illustrating a method of cleaning a substrate using the apparatus in FIG. 13.

Referring to FIGS. 13 to 15, in step ST300, the pump 113 may be driven at an RPM faster than the set RPM.

In step ST302, when the pressure of the cleaning liquid may approach to the set pressure, the RPM of the pump 113 may be decreased to the set RPM. The mismatch time between the pressure of the cleaning liquid and the frequency of the piezoelectric element 116 may be decreased by controlling the RPM of the pump 113. As a result, the damage of the patterns P caused by the mismatch between the pressure of the cleaning liquid and the frequency of the piezoelectric element 116 may be reduced.

In step ST304, the cleaning droplet-injecting nozzle 112 may inject the cleaning droplets to the upper surface of the substrate W while being moved from the first edge portion of the substrate W to the second edge portion of the substrate W through the central portion of the substrate W.

In step ST306, while the cleaning droplet-injecting nozzle 112 moves from the first edge portion of the substrate W to the central portion of the substrate W, the first protecting liquid-spraying nozzle 122 positioned right of the cleaning droplet-injecting nozzle 112 may spray the protecting liquid to the upper surface of the substrate in the first spray direction, e.g., from above the central portion of the substrate W to the first edge portion of the substrate W.

In step ST308, when the cleaning droplet-injecting nozzle 112 arrives at the central portion of the substrate W, the controller 140a may stop spraying protecting liquid form the first protecting liquid-spraying nozzle 122. The controller 140a may drive the second protecting liquid-spraying nozzle 122a to spray protecting liquid.

In step ST310, while the cleaning droplet-injecting nozzle 112 moves from the central portion of the substrate W to the second edge portion of the substrate W, the second protecting liquid-spraying nozzle 122a positioned left of the cleaning droplet-injecting nozzle 112 may spray the protecting liquid to the upper surface of the substrate in the second spray direction, e.g., from above the central portion of the substrate W to the second edge portion of the substrate W.

Therefore, because the protecting liquid may always be sprayed from the central portion of the substrate W to the edge portions of the substrate W, the protecting liquid on the edge portions of the substrate W may be sufficiently thick. As a result, the patterns P on the edge portions of the substrate W may not be damaged.

In step ST312, the first and second thickness sensors 130 and 130a may measure the thicknesses of the protecting liquid on the patterns P while the first and second protecting liquid-spraying nozzles 122 and 122a sprays the protecting liquid.

In step ST314, the controller 140a may control the cleaning droplet-injecting nozzle 112 and/or the first and second protecting liquid-spraying nozzle 122 and 122a in accordance with the measured thicknesses of the protecting liquid by regions. The controller 140a may control the injection height of the cleaning droplet-injecting nozzle 112 and/or the spray flux of the protecting liquid.

Therefore, the detergency may be improved, and the damage of the patterns P may be reduced by controlling the cleaning droplet-injecting nozzle 112 and/or the first and second protecting liquid-spraying nozzles 122 and 122a in accordance with the thicknesses of the protecting liquid.

Figure 16:
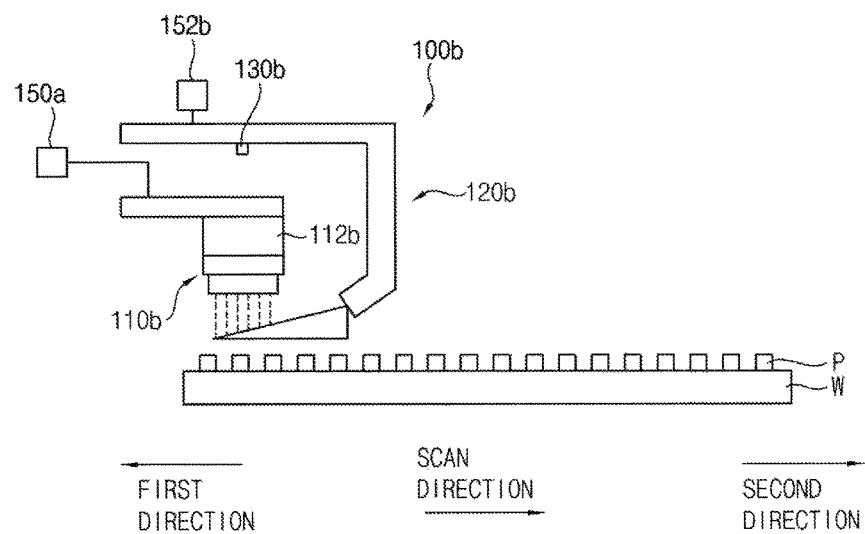
Figure 17:
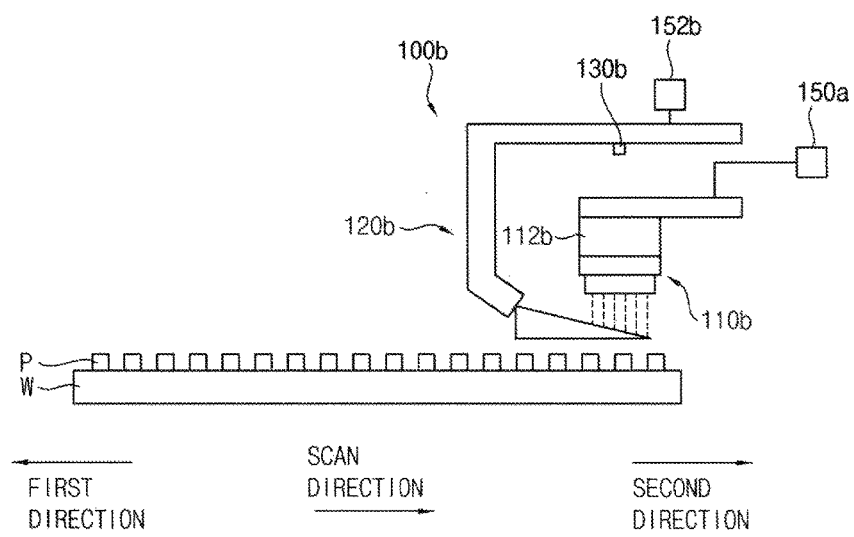

FIGS. 16 and 17 are cross-sectional views illustrating an apparatus for cleaning a substrate in accordance with example embodiments.

Referring to FIGS. 16 and 17, an apparatus 100b for cleaning a substrate in accordance with example embodiments may include a cleaning droplet-injecting unit 110b, a protecting liquid-spraying unit 120b, a thickness sensor 130b, a controller, a first actuator 150a, and a second actuator 152b.

The cleaning droplet-injecting unit 110b may be separated from the protecting liquid-spraying unit 120b. For example, the cleaning droplet-injecting unit 110b and the protecting liquid-spraying unit 120b may be independently driven. The cleaning droplet-injecting unit 110b may include the first actuator 150a for independently driving the cleaning droplet-injecting unit 110b. The protecting liquid-spraying unit 120b may include the second actuator 152b for independently driving the protecting liquid-spraying unit 120b.

Because the cleaning droplet-injecting unit 110b and the protecting liquid-spraying unit 120b may be independently driven, the second actuator 152b may move the protecting liquid-spraying unit 120b in accordance with positions of the cleaning droplet-injecting unit 110b. For example, the second actuator 152b may move the protecting liquid-spraying unit 120b to provide a spray direction of the protecting liquid-spraying unit 120b with the first spray direction or the second spray direction. Alternatively, the spray direction of the protecting liquid-spraying unit 120b set by the second actuator 152b may not be restricted within the first spray direction and the second spray direction. For example, the spray direction of the protecting liquid may be a direction heading from above a center portion of the substrate W to an edge portion of the substrate W, which may be a direction other than the first and second spray directions. For example, the spray direction of the protecting liquid may have an acute angle with respect to a direction parallel to a line extending from a center portion of the substrate W to an edge portion of the substrate W. For example, the protecting liquid spraying nozzle 120b may be configured to have an acute angle with respect to an upper surface of the substrate W while the nozzle 120b sprays a protecting liquid.

FIG. 18 is a flow chart illustrating a method of cleaning a substrate using the apparatus in FIG. 16.

Referring to FIGS. 16 to 18, in step ST400, the pump 113 may be driven at an RPM faster than the set RPM.

In step ST402, when the pressure of the cleaning liquid may approach to the set pressure, the RPM of the pump 113 may be decreased to the set RPM. The mismatch time between the pressure of the cleaning liquid and the frequency of the piezoelectric element 116 may be decreased by controlling the RPM of the pump 113. As a result, the damage of the patterns P caused by the mismatch between the pressure of the cleaning liquid and the frequency of the piezoelectric element 116 may be reduced.

In step ST404, the cleaning droplet-injecting nozzle 112b may inject the cleaning droplets to the upper surface of the substrate W while the cleaning droplet-injecting nozzle 112b moves from the first edge portion of the substrate W to the second edge portion of the substrate W through the central portion of the substrate W.

In step ST406, while the cleaning droplet-injecting nozzle 112b is moved by the first actuator 150b from the first edge portion of the substrate W to the central portion of the substrate W, the protecting liquid-spraying nozzle 122b positioned right of the cleaning droplet-injecting nozzle 112b may spray the protecting liquid to the upper surface of the substrate in the first spray direction, e.g., from above the central portion of the substrate W to the first edge portion of the substrate W.

In step ST408, when the cleaning droplet-injecting nozzle 112b arrives at the central portion of the substrate W, the second actuator 152b may move the protecting liquid-spraying nozzle 122 to a region left of the cleaning droplet-injecting nozzle 112b.

In step ST410, while the cleaning droplet-injecting nozzle 112b moves from the central portion of the substrate W to the second edge portion of the substrate W, the protecting liquid-spraying nozzle 122b positioned left of the cleaning droplet-injecting nozzle 112b may spray the protecting liquid to the upper surface of the substrate in the second spray direction, e.g., from above the central portion of the substrate W to the second edge portion of the substrate W.

Therefore, because the protecting liquid may always be sprayed from the central portion of the substrate W to the edge portions of the substrate W, the protecting liquid on the edge portions of the substrate W may be sufficiently thick, e.g., to protect patterns being underneath. As a result, the patterns P on the edge portions of the substrate W may not be damaged.

In step ST412, the thickness sensor 130b may measure the thicknesses of the protecting liquid on the patterns P while the protecting liquid-spraying nozzle 122b sprays the protecting liquid.

In step ST414, the controller may control the cleaning droplet-injecting nozzle 112b and/or the protecting liquid-spraying nozzle 122b in accordance with the measured thicknesses of the protecting liquid by regions. The controller may control the injection height of the cleaning droplet-injecting nozzle 112b and/or the spray flux of the protecting liquid.

Therefore, the detergency may be improved, and the damage of the patterns P may be reduced by controlling the cleaning droplet-injecting nozzle 112b and/or the protecting liquid-spraying nozzle 122b in accordance with the thicknesses of the protecting liquid.

According to example embodiments, while the cleaning droplets are injected to the surface of the substrate from a first edge portion of the substrate toward a central portion of the substrate, the protecting liquid may be sprayed from the central portion of the substrate toward the first edge portion of the substrate. In contrast, while the cleaning droplets are injected to the surface of the substrate from the central portion of the substrate toward a second edge portion of the substrate, the protecting liquid may be sprayed from the central portion of the substrate toward the second edge portion of the substrate. For example, the protecting liquid may be always sprayed from the central portion toward the edge portions in the substrate so that the protecting liquid on the substrate may have a uniform thickness. As a result, efficiency for removing byproducts may be improved, and damage of patterns on the substrate may be reduced.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures.

Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of manufacture, the method comprising:
providing a substrate on a support;
spraying a protecting liquid on a first portion of a surface of the substrate from a first position in a first spray direction;
injecting cleaning droplets on the first portion of the surface of the substrate;
spraying the protecting liquid on a second portion of the surface of the substrate from a second position different from the first position in a second spray direction different from the first spray direction; and
injecting cleaning droplets on the second portion of the surface of the substrate,
wherein: the second portion of the surface is a different portion from the first portion of the surface,
the protecting liquid is sprayed from a protection liquid-spraying unit,
the cleaning droplets are sprayed from a cleaning droplet-injecting unit,
the protection liquid-spraying unit moves with respect to the cleaning droplet-injecting unit,
injecting the cleaning droplets comprises moving a head providing the cleaning droplets from a first edge of the substrate to a second edge of the substrate through a center portion of the substrate,
the spray directions of the protecting liquid from a nozzle switch from the first spray direction to the second spray direction when the head reaches the center portion of the substrate, and
the second spray direction is the opposite direction of the first spray direction.

2. A method of manufacture, the method comprising:
providing a substrate on a support;
spraying a protecting liquid on a first portion of a surface of the substrate from a first position in a first spray direction;
injecting cleaning droplets on the first portion of the surface of the substrate;
spraying the protecting liquid on a second portion of the surface of the substrate from a second position different from the first position in a second spray direction different from the first spray direction; and
injecting cleaning droplets on the second portion of the surface of the substrate,
wherein the second portion of the surface is a different portion from the first portion of the surface, and
wherein the first position is located above the substrate and between a central portion of the substrate and a first edge portion of the substrate, the first spray direction extends from above the central portion of the substrate to the first edge portion of the substrate, the second position is located above the substrate and between the central portion of the substrate and a second edge portion of the substrate opposite the first edge portion, and the second spray direction extends from above the central portion of the substrate to the second edge portion of the substrate.

3. The method of claim 2, wherein injecting the cleaning droplets comprises injecting the cleaning droplets from the first edge portion of the substrate to the second edge portion of the substrate through the central portion of the substrate.

4. The method of claim 3, wherein spraying the protecting liquid from the first position in the first spray direction is performed while the cleaning droplets are injected from the first edge portion of the substrate to the central portion of the substrate, and spraying the protecting liquid from the second position in the second spray direction is performed while the cleaning droplets are injected from the central portion of the substrate to the second edge portion of the substrate.

5. The method of claim 1, wherein the first and second spray directions are inclined with respect to the surface of the substrate at an acute angle, and an injection direction of the cleaning droplets is substantially perpendicular to the surface of the substrate.

6. The method of claim 1, further comprising:
measuring thicknesses of the protecting liquid on the substrate; and
in accordance with the thicknesses of the protecting liquid, controlling a spray flux of the protecting liquid or an injection pressure of the cleaning droplets.

7. The method of claim 6, wherein controlling the injection pressure of the cleaning droplets comprises controlling an injection height where the cleaning droplets are released from a cleaning-droplet injecting unit over the surface of the substrate.

8. A method of manufacture, the method comprising:
providing a substrate on a support;
spraying a protecting liquid on a first portion of a surface of the substrate from a first position in a first spray direction;
injecting cleaning droplets on the first portion of the surface of the substrate;
spraying the protecting liquid on a second portion of the surface of the substrate from a second position different from the first position in a second spray direction different from the first spray direction; and
injecting cleaning droplets on the second portion of the surface of the substrate,
wherein the second portion of the surface is a different portion from the first portion of the surface,
wherein the first spray direction comprises a horizontal component in a direction from a center portion of the substrate to a first edge of the substrate,
wherein the second spray direction comprises a horizontal component in a direction from the center portion of the substrate to a second edge of the substrate,
wherein the second edge of the substrate is opposite the first edge of the substrate,
wherein the cleaning droplets are a cleaning liquid that cleans the substrate, and
wherein the protecting liquid protects the substrate from damage by the cleaning liquid.

9. The method of claim 1, wherein:
the protection liquid-spraying unit comprises a protecting liquid-spraying nozzle rotatably connected with the cleaning droplet-injecting unit with respect to a vertical axis substantially perpendicular to the surface of the substrate, and
the vertical axis overlaps the cleaning droplet-injecting unit in a plan view.

10. The method of claim 1, furthering comprising:
pumping a cleaning liquid through a first pipe with a pump to provide the cleaning liquid on the first portion of the substrate and to provide the cleaning liquid on the second portion of the substrate,
wherein the pump operates with a first power when the pump initially provides the cleaning liquid for a predetermined time and operates with a second power after the predetermined time,
wherein the first power is higher than the second power.

11. The method of claim 10,
wherein the protecting liquid is provided to a nozzle via a second pipe, and
wherein the first pipe is thermally insulated from the second pipe.

12. The method of claim 1, wherein the protecting liquid is provided to the substrate from at least two different nozzles.

* * * * *